(12) United States Patent
Choi et al.

(10) Patent No.: US 8,593,063 B2
(45) Date of Patent: Nov. 26, 2013

(54) WHITE LIGHT EMITTING DEVICE (75) Inventors: Pun Jae Choi, Kyungki-do (KR);
Masayoshi Koike, Kyungki-do (KR);
Sang Yeob Song, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/474,240

(22) Filed: May 17, 2012

(65) Prior Publication Data

US 2012/0223660 A1  Sep. 6, 2012

Related U.S. Application Data

(62) Division of application No. 11/600,107, filed on Nov. 16, 2006, now abandoned.

(30) Foreign Application Priority Data

Dec. 27, 2005 (KR) ........................ 10-2005-0130652

(51) Int. Cl.
*H05B 33/00* (2006.01)
*H01J 1/62* (2006.01)

(52) U.S. Cl.
USPC .......................................... 313/512; 313/504

(58) Field of Classification Search
USPC .................. 313/506, 512, 504; 445/23–25
See application file for complete search history.

(56) References Cited

U.S. PATENT DOCUMENTS

| 6,252,254 B1 * | 6/2001 | Soules et al. ................... 257/89 |
| 6,730,943 B2 | 5/2004 | Massies et al. |
| 7,279,716 B2 | 10/2007 | Chen |
| 2002/0030197 A1 | 3/2002 | Sugawara et al. |
| 2002/0070681 A1 | 6/2002 | Shimizu et al. |
| 2003/0063462 A1 | 4/2003 | Shimizu et al. |
| 2003/0067773 A1 | 4/2003 | Marshall et al. |
| 2004/0089864 A1 | 5/2004 | Chi et al. |
| 2004/0262617 A1 | 12/2004 | Hahm et al. |

FOREIGN PATENT DOCUMENTS

| JP | 2001-257379 | 9/2001 |
| JP | 2002-057376 | 2/2002 |
| JP | 2003-045206 | 2/2003 |
| JP | 2003-515956 A | 5/2003 |
| JP | 2003-197968 | 7/2003 |
| JP | 2003-530703 | 10/2003 |
| JP | 2005-005482 | 1/2005 |
| JP | 2005-019936 | 1/2005 |
| JP | 2005-303320 | 10/2005 |
| WO | WO01/41215 A | 6/2001 |
| WO | WO 2005/112137 A1 | 11/2005 |

OTHER PUBLICATIONS

Japanese Office Action, w/ English Translation thereof issued in Japanese Patent No. 2010-014474 dated Sep. 6, 2010 which issued Nov. 20, 2012.

(Continued)

*Primary Examiner* — Joseph L Williams
(74) *Attorney, Agent, or Firm* — McDermott Will & Emery LLP (57) ABSTRACT

A white light emitting device includes a structure for emitting white light having at least four wavelengths by using two or less LEDs, where the LEDs include a blue/green LED emitting blue and green wavelengths of light. The device also includes means for emitting red wavelength of light.

8 Claims, 6 Drawing Sheets

(56) References Cited

OTHER PUBLICATIONS

Japanese Office Action issued in Japanese Patent Application No. JP 2006-307458, dated Oct. 27, 2009.

Japanese Decision of Rejection, w/ English translation thereof, issued in Japanese Patent Application No. JP 2006-307458 dated Jan. 4, 2011.

* cited by examiner

WHITE LIGHT EMITTING DEVICE

RELATED APPLICATIONS

This application is a Divisional of U.S. Application Ser. No. 11/600,107, filed on Nov. 16, 2006, now abandoned which claims the benefit of Korean Patent Application No. 2005-130652 filed on Dec. 27, 2005, the entire contents of each of which are incorporated herein by reference.

BACKGROUND OF THE INVENTION

1. Field of the Invention

The present invention relates to a white light emitting device, and more particularly, to a white light emitting device using up to two LEDs to achieve superior color reproducibility and high efficiency.

2. Description of the Related Art

In general, a white LED apparatus is preferred over a conventional small-sized lamp or a fluorescent lamp as a backlight of a Liquid Crystal Display (LCD). The white LED apparatus can be manufactured by forming a ceramic phosphor layer on a light exiting surface of a blue LED.

The most representative type of conventional white LED apparatus is realized by combining a GaN-based blue LED with YAG-based yellow phosphor. The blue light emitted from the blue LED excites the phosphor to emit yellow light. A mixture of blue light and yellow light is perceived as white light by the observer. Such a white LED apparatus has advantages like relatively high efficiency and low costs but also drawbacks like mediocre color reproducibility.

Figure 1:
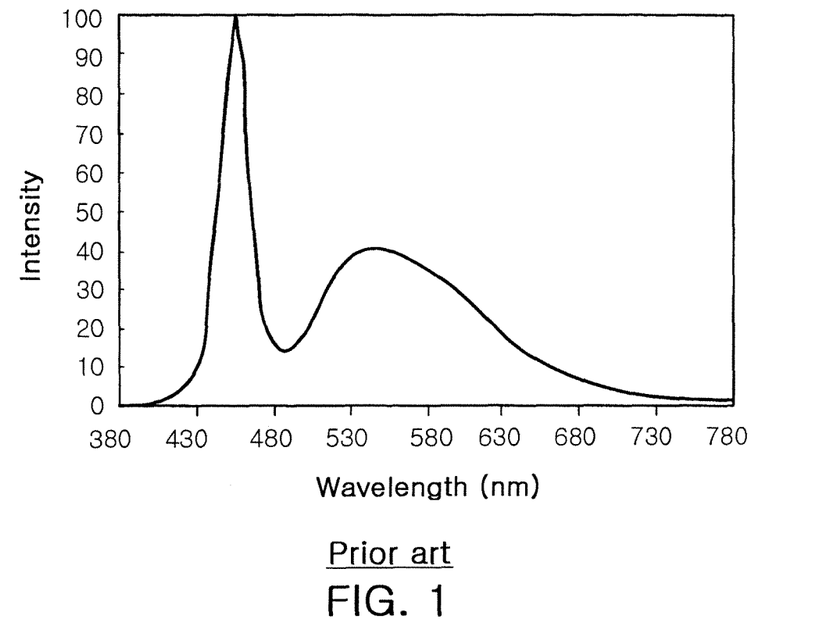
FIG. 1 is a graph showing a light emission spectrum of a conventional white light emitting device according to the prior art.

FIG. 1 shows a light emission spectrum of a conventional white light emitting device manufactured by combining a GaN-based blue LED with YAG-based yellow phosphor. As shown in FIG. 1, the light intensity is high in the blue and yellow regions but low in the green and red regions. Therefore, such a white light emitting device does not well express the green and red regions, thus having a mediocre color rendering index and color reproducibility.

Figure 2:
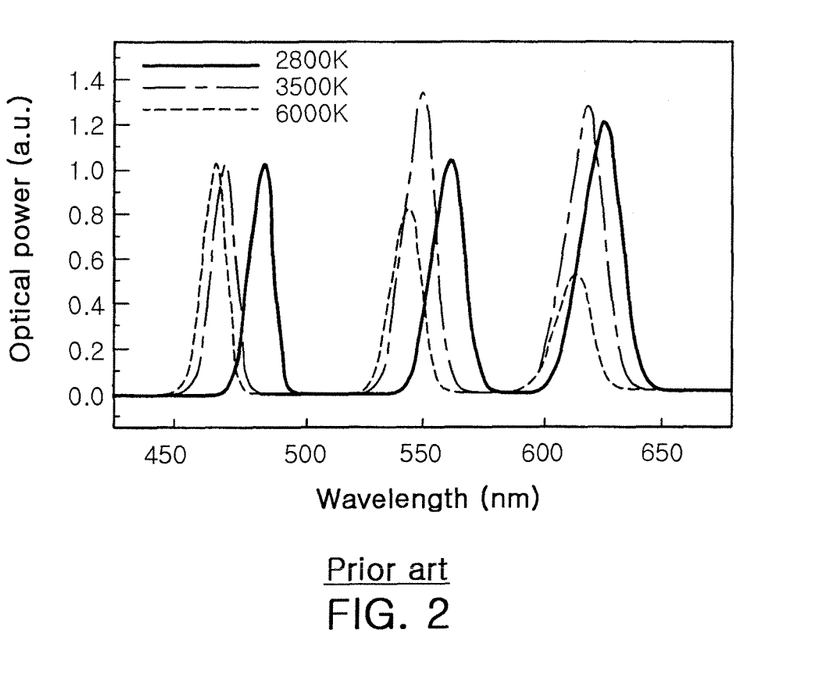
FIG. 2 is a graph showing light emission spectrums of another type of conventional light emitting devices according to the prior art.

Alternatively, a white light LED apparatus may be realized by combining blue, green and red LEDs. FIG. 2 shows light emission spectrums of such a type of conventional white LED apparatuses composed of blue, green and red LEDs. In particular, FIG. 2 shows light emission spectrums of white LED apparatuses with different correlated color temperatures. Such white LED apparatuses have relatively good color reproducibility but with high power consumption and low efficiency. Moreover, these white LED apparatuses are not cost-effective with complex circuit configurations.

As a further alternative, LEDs can be used to realize a white light emitting device by combining an ultraviolet LED (UV LED) with green/blue/red phosphor or a mixture of blue, green and red phosphors. Such a white light emitting device has superior color reproducibility with low costs, but is not yet commonly used and has low efficiency. Therefore, there exists a need for developing a white light emitting device which satisfies a need for high efficiency and high color reproducibility.

SUMMARY OF THE INVENTION

The present invention has been made to solve the foregoing problems of the prior art and therefore an object of certain embodiments of the present invention is to provide a high-quality white light emitting device having high efficiency and superior color reproducibility.

According to an aspect of the invention for realizing the object, there is provided a white light emitting device including: a structure for emitting white light having at least four wavelengths by using two or less light emitting diodes (LEDs), wherein the LEDs comprise a blue/green LED emitting blue and green wavelengths of light; and the device comprising means for emitting red wavelength of light.

The blue/green LED may be an InGaN-based LED. Also the red light emitting means may be an InGaAlP-based LED. Alternatively, the red light emitting means may be red phosphor or a red Photon Recycling System (PRS).

Preferably, the white light emitting device emits white light having a light emission spectrum with a blue peak wavelength in the range of 440 to 470 nm, and a green peak wavelength in the range of 500 to 530 nm, a yellow peak wavelength in the range of 560 to 580 nm and a red peak wavelength in the range of 620 to 640 nm. More preferably, the white light emitting device emits white light having a light emission spectrum with a blue peak wavelength in the range of 450 to 460 nm, a green peak wavelength in the range of 505 to 515 nm, and a yellow peak wavelength in the range of 565 to 575 nm, and a red peak wavelength in the range of 630 to 640 nm. In this case, the white light has a color rendering index of at least 95.

According to an embodiment of the present invention, the white light emitting device may further comprise yellow phosphor, wherein the red light emitting means may comprise at least one selected from a group consisting of a red LED, a red PRS and red phosphor. In this case, the white light emitting device attains white light by mixing the blue, green, yellow and red colors. Preferably, the yellow phosphor has a peak wavelength in the range of 540 to 590 nm.

According to another embodiment of the present invention, the red light emitting means may be an amber/red LED emitting amber and red wavelengths of light. In this case, the white light emitting device attains white light by mixing the blue, green, amber and red colors.

According to further another embodiment of the present invention, the blue/green LED is adapted to emit amber wavelength of light along with blue and green wavelengths of light, and the red light emitting means may be a red LED emitting red wavelength of light. In this case, the white light emitting device uses two LEDs to attain white light by mixing the blue, green, amber and red colors.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals are used throughout to designate the same or like parts.

Figure 3:
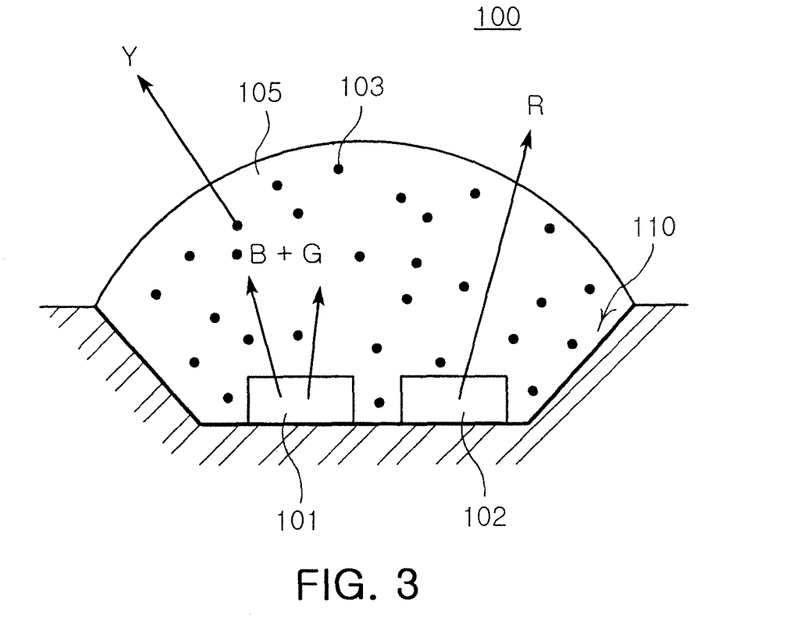
FIG. 3 is a schematic sectional view illustrating a white light emitting device according to an embodiment of the present invention.

FIG. 3 is a schematic sectional view illustrating a white light emitting device according to an embodiment of the present invention. Referring to FIG. 3, the white light emitting device 100 includes a blue/green LED 101 and a red LED 102 mounted in a cup-shaped reflecting recess 110 of a package and yellow phosphor 103. The blue/green LED 101 is a single chip emitting both blue wavelength of light B and green wavelength of light G. The yellow phosphor 103 absorbs the light generated from the LED 101 to generate yellow light Y. The red LED 102 generates red wavelength of light R. Preferably, the blue/green LED 101 is an InGaN-based LED and the red LED 102 is an InGaAlP-based LED.

The blue/green LED 101 and the red LED 102 are encapsulated by a light-transmitting resin 105. The yellow phosphor 103 powders are dispersed in the resin 105. The yellow phosphor 103 may be for example YAG-based yellow phosphor which absorbs the blue light to generate yellow light. In this case, the YAG-based yellow phosphor 103 absorbs a portion of the output light of the blue/green LED 101 and generates the yellow light Y. Preferably, the yellow phosphor 103 emits light having a peak wavelength in the range of 540 to 590nm.

The white light emitting device 100 with the above described configuration outputs white light in a wide range of wavelength using the blue, green, yellow and red light beams generated from the LEDs 101 and 102 and the yellow phosphor 103. Particularly, the white light emitting device 100 generates visible rays with 4 wavelengths using only two LEDs, thus improved in color reproducibility and efficiency at the same time.

To realize white light having a color rendering index of at least 90, it is preferable that the white light emitting device 100 emits white light having a light emission spectrum with a blue peak wavelength in the range of 440 to 470 nm, a green peak wavelength in the range of 500 to 530 nm, a yellow peak wavelength in the range of 560 to 580 nm, and a red peak wavelength in the range of 620 to 640 nm. More preferably, the blue peak wavelength may range from 450 to 460 nm, the green peak wavelength may range from 505 to 515 nm, the yellow peak wavelength may range from 565 to 575 nm, and the red peak wavelength may range from 630 to 640 nm. This allows realizing a high-quality white light emitting device having a color rendering index of at least 95.

With each of the peak wavelengths in each of the above preferable wavelength ranges, the white light emitting device 100 achieves a superior color rendering index (or color reproducibility) and improved power and light efficiency. In particular, in the case where the blue/green LED 101 is an InGaN-based LED and the red LED 102 is an InGaAlP-based LED, the blue/green LED 101 may have a short peak wavelength of up to 470 nm and the red LED 102 may have a long peak wavelength of at least 620 nm to achieve further improved efficiency, which is confirmed as shown in FIG. 5.

Figure 5:
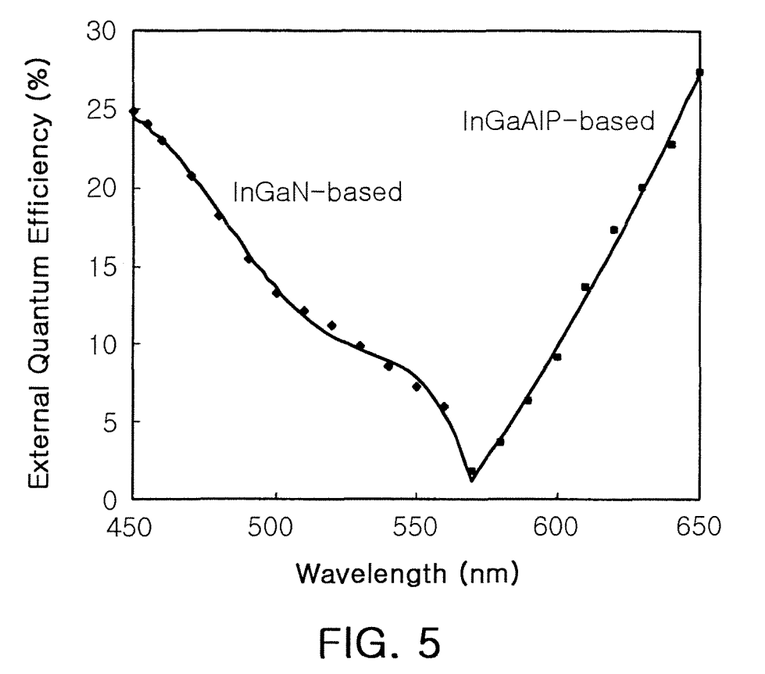
FIG. 5 is a graph showing external quantum efficiency of an InGaN-based LED and an InGaAlP-based LED with respect to wavelength.

FIG. 5 is a graph showing external quantum efficiency of an InGaN-based LED and an InGaAlP-based LED with respect to the wavelength. As shown in FIG. 5, the InGaN-based LED exhibits higher external quantum efficiency with a shorter wavelength (peak wavelength), and the InGaAlP-based LED exhibits higher external quantum efficiency with a longer wavelength (peak wavelength). Using YAG-based phosphor generating a yellow region of light together with an InGaN-based blue/green LED having a peak wavelength of up to 470 nm and an InGaAlP-based red LED having a peak wavelength of at least 620 nm, the white light emitting device can achieve high efficiency in an entire visible ray region and high luminance of at least 50lm/W.

Figure 4:
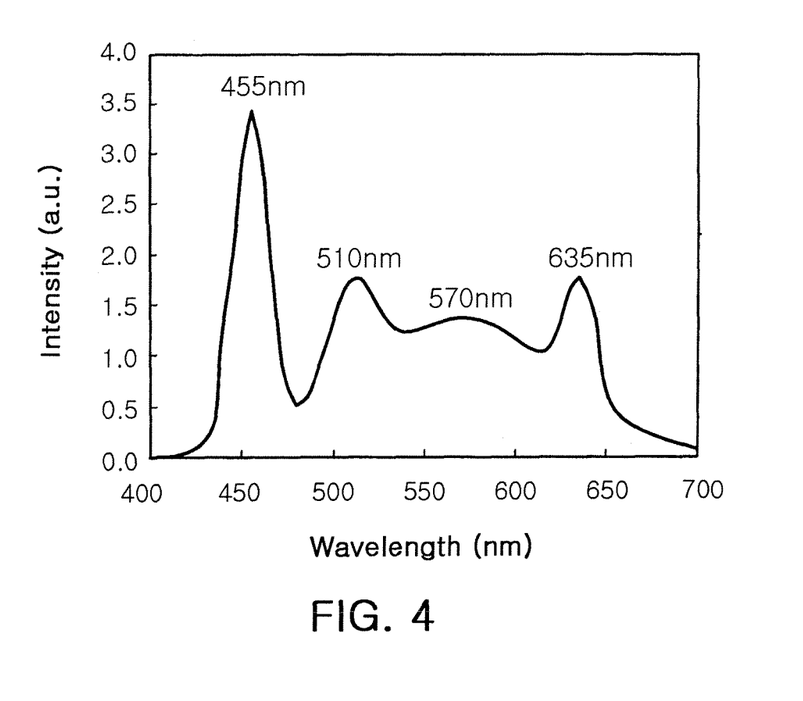
FIG. 4 is a graph showing a light emission spectrum of the white light emitting device shown in FIG. 3.

FIG. 4 is a graph showing a light emission spectrum of the white light emitting device shown in FIG. 3. As shown in FIG. 4, the white light emitting device 100 emits white light having peak wavelengths in the blue, green, yellow and red regions at 455 nm, 510 nm, 570 nm and 635 nm, respectively. Such a wide visible ray spectrum with 4 wavelengths allows high color reproducibility and a high color rendering index, thereby resulting in a high-quality white light close to natural light.

Figure 6:
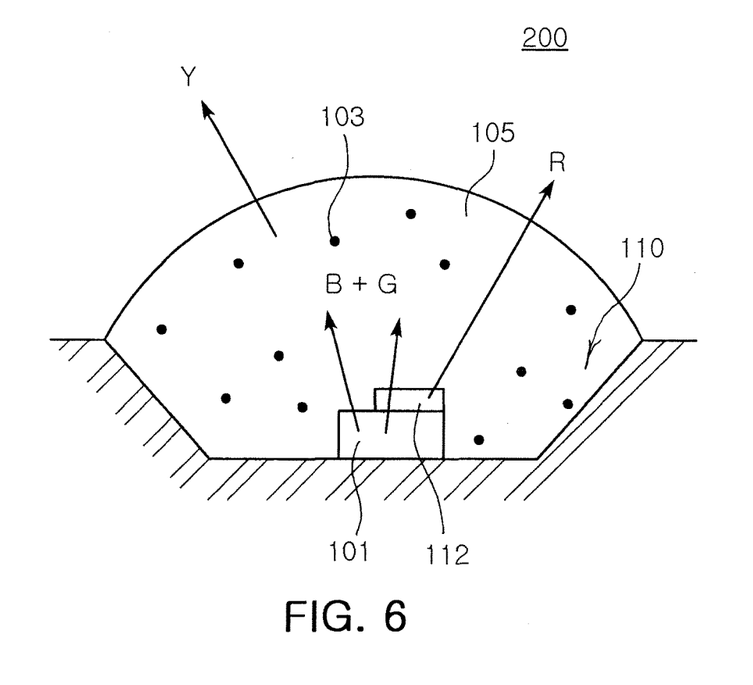
FIG. 6 is a schematic sectional view illustrating a white light emitting device according to another embodiment of the present invention.

FIG. 6 illustrates a white light emitting device according to another embodiment of the present invention. As shown in FIG. 6, the white light emitting device 200 according to this embodiment is distinguished from the previously described white light emitting device 100 in that it includes a red Photon Recycling System (PRS) 112 instead of the red LED.

In general, the PRS, like any phosphor, absorbs light from other light source to generate a different wavelength of light without any voltage applied. However, unlike the phosphor, the PRS is made of semiconductor material. Such red PRS 112 is disposed on a light exiting surface of the blue/green LED 101, absorbing the blue light (or green light) emitted from the LED 101 to generate red light R. Using only one LED (blue/green LED 101) to output white light having a wide spectrum with 4 wavelengths, the white light emitting device 200 has high efficiency and superior color reproducibility.

Figure 7:
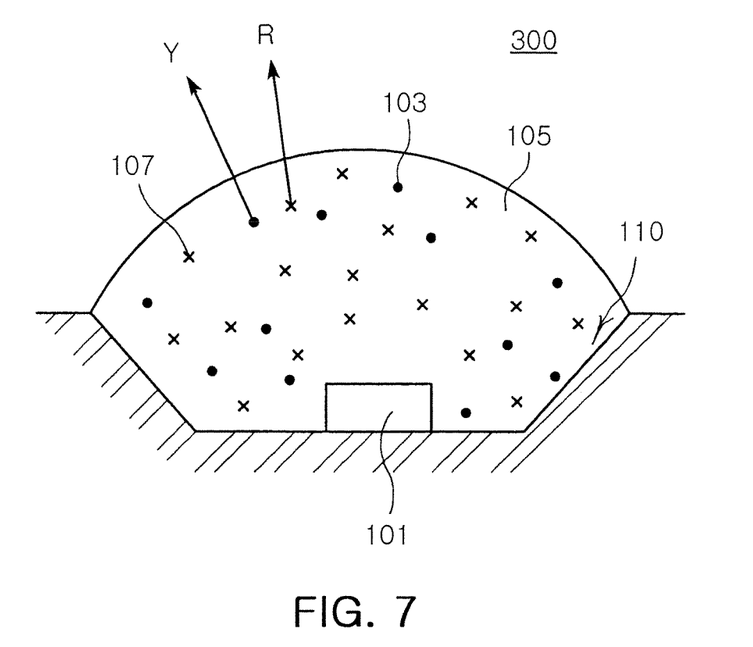
FIG. 7 is a schematic sectional view illustrating a white light emitting device according to further another embodiment of the present invention.

FIG. 7 illustrates a white light emitting device 300 according to further another embodiment of the present invention. The white light emitting device 300 according to this embodiment is distinguished from the previously described white light emitting device 100 in that it includes red phosphor 107 instead of the red LED.

As shown in FIG. 7, the blue/green LED 101, the yellow phosphor 103 and the red phosphor 107 emanate blue, green, yellow and red colors, respectively, thereby attaining a visible ray spectrum with 4 wavelengths. Similar to the aforedescribed embodiment, only one LED (blue/green LED 101) is used in the white light emitting device 300 in this embodiment to output white light with 4 wavelengths, achieving high efficiency and superior color reproducibility. For the red phosphor, phosphor having a composition, $Sr_xCa_{1-x}S:Eu^{2+}$, where x is greater than or equal to 0 and less than or equal to 1, can be used. The phosphor, $Sr_xCa_{1-x}S:Eu^{2+}$ absorbs blue light to emanate red light.

Figure 8:
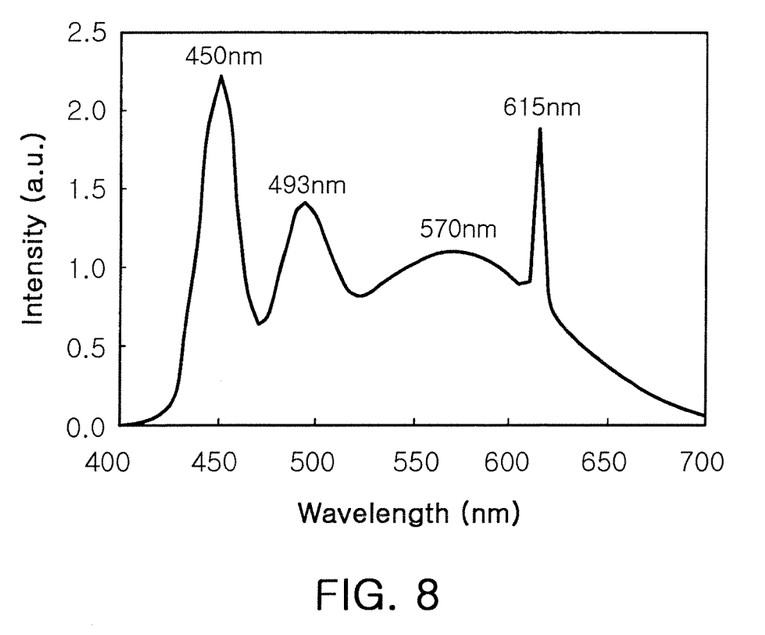
FIG. 8 is a graph showing a light emission spectrum of the white light emitting device shown in FIG. 7.

FIG. 8 shows a light emission spectrum of the white light emitting device 300 shown in FIG. 7. As shown in FIG. 8, the light emission spectrum exhibits peak wavelengths in the blue, green, yellow and red regions at 450 nm, 493 nm, 570 nm and 615 nm, respectively. With the respective peak wavelengths in the 4 wavelength regions, the white light emitting device 300 achieves high color reproducibility and a high color rendering index.

Figure 9:
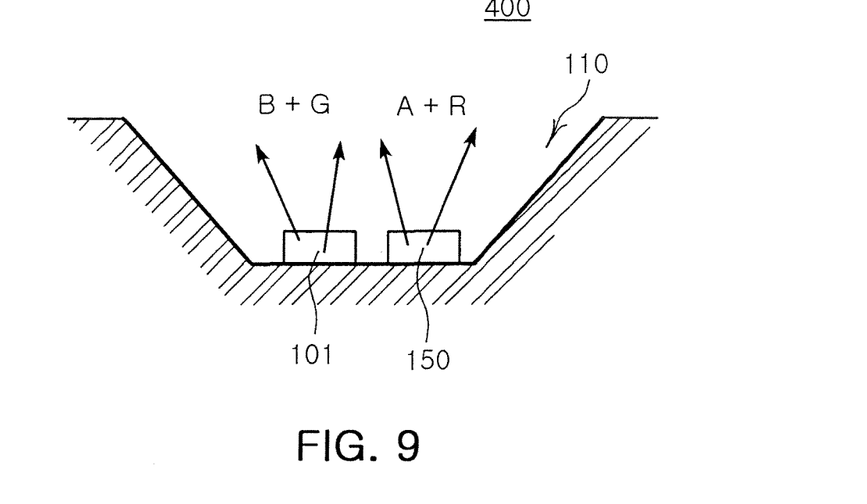
FIG. 9 is a schematic sectional view illustrating a white light emitting device according to still another embodiment of the present invention.

FIG. 9 illustrates a white light emitting device according to yet another embodiment of the present invention. Referring to FIG. 9, the white light emitting device 400 includes a blue/green LED 101 mounted in a cup-shaped reflecting recess of a package and an amber/red LED 150. Therefore, in this embodiment, two LEDs (the blue/green LED and the amber/red LED) emit a blue light beam B, a green light beam G, an amber light beam A and a red light beam R. Using only two LEDs to output white light having a wide spectrum with 4 wavelengths, the white light emitting device 400 has high efficiency and superior color reproducibility.

Figure 10:
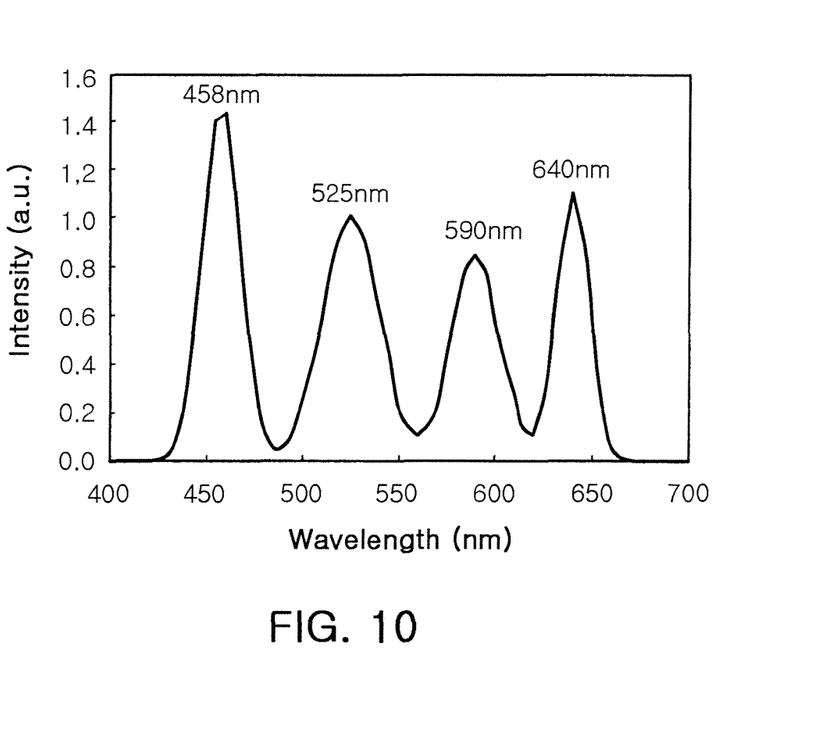
FIG. 10 is a graph showing a light emission spectrum of the white light emitting device shown in FIG. 9.

FIG. 10 shows a light emission spectrum of the white light emitting device 400 shown in FIG. 9. As shown in FIG. 10, the white light emitting device 400 emits white light having a light emission spectrum with peak wavelengths at 458 nm, 525 nm, 590 nm and 640 nm, respectively. With the respective peak wavelengths in a wide visible ray region with 4 wavelengths, the white light emitting device 400 achieves high color reproducibility and a high color rendering index.

Figure 11:
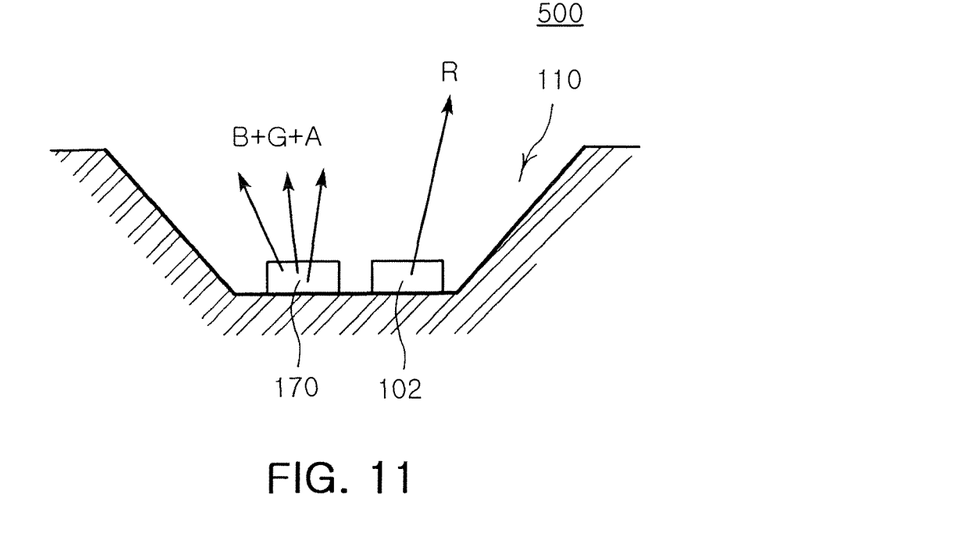
FIG. 11 is a schematic sectional view illustrating a white light emitting device according to yet another embodiment of the present invention.

FIG. 11 illustrates a white light emitting device according to still another embodiment of the present invention. Referring to FIG. 11, the white light emitting device 500 includes a blue/green LED 170 mounted in a cup-shaped reflecting recess of a package and a red LED 102. Unlike in the aforedescribed embodiments, the blue/green LED 170 emits not only blue and green light but also amber light. That is, the blue/green LED 170 is a three-wavelength LED emitting blue, green and amber wavelengths of light. Such a three-wavelength LED can be realized by altering the In content of an InGaN layer in an active layer of multiple quantum well.

Figure 12:
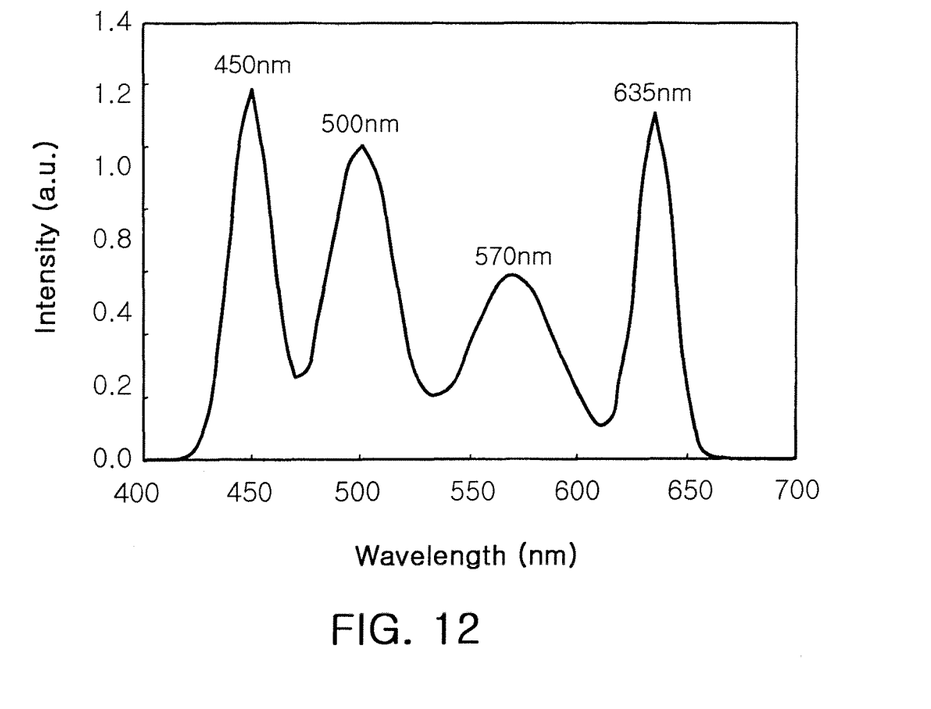
FIG. 12 is a graph showing a light emission spectrum of the white light emitting device shown in FIG. 11.

The blue light B, green light G and amber light A emitted from the blue/green LED 170 and the red light R emitted from the red LED 102 are mixed to produce high-quality white light having a wide spectrum with 4 wavelengths. The light emission spectrum of the white light emitting device 500 is shown in FIG. 12. As shown in FIG. 12, the white light emitting device 500 has peak wavelengths at 450 nm, 500 nm, 570 nm and 635 nm, respectively to output high-quality white light with 4 wavelengths.

According to the present invention set forth above, the white light emitting device uses two or less LEDs to output white light having a wide spectrum with 4 wavelengths, thereby achieving superior color reproducibility and high efficiency.

While the present invention has been shown and described in connection with the preferred embodiments, it will be apparent to those skilled in the art that modifications and variations can be made without departing from the spirit and scope of the invention as defined by the appended claims.

What is claimed is:

1. A white light emitting device comprising:
a structure for emitting white light having at least four peak wavelengths by using only one light emitting diode (LED), wherein the LED is a blue/green LED emitting light having a blue peak wavelength and light having a green peak wavelength; and
the device comprising a red phosphor emitting light having a red peak wavelength,
wherein the blue/green LED has an active layer having a multi quantum well structure emitting the blue and green light.

2. The white light emitting device according to claim 1, wherein the white light has a light emission spectrum with a blue peak wavelength in the range of 440 to 470 nm, and a green peak wavelength in the range of 500 to 530 nm, a yellow peak wavelength in the range of 560 to 580 nm and a red peak wavelength in the range of 620 to 640 nm.

3. The white light emitting device according to claim 1, wherein the white light has a light emission spectrum with a blue peak wavelength in the range of 450 to 460 nm, a green peak wavelength in the range of 505 to 515 nm, and a yellow peak wavelength in the range of 565 to 575 nm, and a red peak wavelength in the range of 630 to 640 nm.

4. The white light emitting device according to claim 3, wherein the white light has a color rendering index of at least 95.

5. A white light emitting device for emitting white light having at least four peak wavelengths comprising:
a housing with a recess therein;
a blue/green LED disposed on the recess and emitting light having a blue peak wavelength and light having a green peak wavelength respectively; and
a red phosphor disposed in the recess and emitting light having a red peak wavelength,
wherein the blue/green LED has an active layer having a multi quantum well structure emitting the blue and green light, and
the white light emitting device emits white light having at least four peak wavelengths by using only one light emitting diode.

6. The white light emitting device according to claim 5, further comprising yellow phosphor covering the blue/green LED and the red phosphor.

7. A light emitting device for emitting white light comprising:
a housing;
a blue/green LED disposed in the housing emitting light having a blue peak wavelength and light having a green peak wavelength respectively; and
a red phosphor provided in the housing and emitting light having a red peak wavelength,
wherein the light emitting device emits white light having at least four peak wavelengths by using only one light emitting diode.

8. The light emitting device according to claim 7, wherein the blue/green LED has an active layer having a multi quantum well structure emitting the light having a blue peak wavelength and the light having a green peak wavelength.

* * * * *